(12) United States Patent
Berger

(10) Patent No.: US 6,710,351 B2
(45) Date of Patent: Mar. 23, 2004

(54) EUV MIRROR BASED ABSOLUTE INCIDENT FLUX DETECTOR

(75) Inventor: Kurt W. Berger, Livermore, CA (US)

(73) Assignee: EUV, LLC, Santa Clara, CA (US)

( * ) Notice: Subject to any disclaimer, the term of this patent is extended or adjusted under 35 U.S.C. 154(b) by 158 days.

(21) Appl. No.: 09/956,397

(22) Filed: Sep. 18, 2001

(65) Prior Publication Data

US 2003/0052275 A1 Mar. 20, 2003

(51) Int. Cl.[7] ............................. G01J 1/42; G03B 1/00
(52) U.S. Cl. ............................. 250/372; 250/365
(58) Field of Search .......................... 250/372, 365, 250/370.01; 356/400, 401, 500; 204/298.07

(56) References Cited

U.S. PATENT DOCUMENTS

| | | | |
|---|---|---|---|
| 4,464,572 A | 8/1984 | Hirschfeld | |
| 4,590,376 A | 5/1986 | Smith | |
| 5,122,737 A | 6/1992 | Clauberg | |
| 5,140,381 A | 8/1992 | Badoz et al. | |
| 5,598,014 A | * 1/1997 | Barany et al. | 257/187 |
| 5,747,840 A | 5/1998 | Merrill | |
| 5,982,011 A | 11/1999 | Kalnitsky et al. | |
| 6,074,892 A | 6/2000 | Bowers et al. | |
| 6,091,093 A | 7/2000 | Kang et al. | |
| 6,130,431 A | * 10/2000 | Berger | 250/372 |
| 6,521,101 B1 | * 2/2003 | Skulina et al. | 204/192.27 |
| 2003/0058429 A1 | * 3/2003 | Schriever | 355/133 |

* cited by examiner

Primary Examiner—Constantine Hannaher
Assistant Examiner—Otilia Gabor
(74) Attorney, Agent, or Firm—Fliesler Meyer LLP

(57) ABSTRACT

A device for the in-situ monitoring of EUV radiation flux includes an integrated reflective multilayer stack. This device operates on the principle that a finite amount of in-band EUV radiation is transmitted through the entire multilayer stack. This device offers improvements over existing vacuum photo-detector devices since its calibration does not change with surface contamination.

32 Claims, 1 Drawing Sheet

EUV MIRROR BASED ABSOLUTE INCIDENT FLUX DETECTOR

This invention was made with Government support under Contract No. DE-AC04-94-AL85000 awarded by the U.S. Department of Energy to Sandia Corporation. The Government has certain rights to the invention.

FIELD OF THE INVENTION

This invention relates to a flux detector device and more particularly to an absolute incident extreme-ultraviolet radiation detector for in-situ monitoring.

BACKGROUND OF THE INVENTION

In general lithography refers to processes for pattern transfer between various media. Projection lithography is a powerful and essential tool for microelectronics processing. FIG. 2 schematically depicts an apparatus for extreme-ultraviolet (EUV) lithography that comprises a radiation source 11, such as a synchrotron or a laser plasma source, that emits EUV radiation 12 into condenser 13 which in turn emits beam of light 14 that illuminates a portion of reticle or mask 15. The emerging patterned beam is introduced into the imaging optics 16 which projects an image of mask 15, shown mounted on mask stage 17, onto wafer 18 which is mounted on stage 19. Element 20, an x-y scanner, scans mask 15 and wafer 18 in such direction and at such relative speed as to accommodate the desired mask-to-image reduction.

Measuring and regulating the EUV radiation flux through the lithography system is critical to maximizing performance. Prior art techniques for measuring the flux typically employed devices with EUV-sensitive vacuum photodiodes, which were difficult to calibrate to an absolute standard. One reason is that the electronic work function of the surface on which the EUV radiation impinged was influenced by environmental conditions. This phenomenon is commonly known in the art to as "band bending." For instance, surface contamination caused the work function to vary. Since the detector's response changed with environmental conditions, it was necessary to continuously recalibrate the devices. The art is in need of a reliable, cost effective EUV radiation flux detector whose calibration.

SUMMARY OF THE INVENTION

The invention is based in part on the recognition that an EUV mirror based, absolute flux detector can be fabricated by embedding an integral EUV photodiode beneath a multilayer reflection stack. This detector exploits the fact that a multilayer reflection stack can be designed to selectively transmit a desired amount of radiation through the stack. For example, a 40 bi-layer molybdenum/silicon EUV multilayer reflection stack allows the transmission of approximately 0.7% of the mirror's programmed peak wavelength through the stack. Since the intensities typically incident on the multilayer are quite high (approximately $10^9$–$10^{13}$ photons/$cm^2$ shot), the signal generated on the photodiode after the 1:1000 attenuation will be quite high. Given that the detector has a multilayer reflection stack as the radiation incident surface, and that the diode detector does not respond to the photoelectric current originating from the surface of the detector (the way a vacuum photodiode operates), the response of this detector will not substantially change with time and/or environmental conditions.

In one embodiment, the invention is directed to an extreme ultraviolet (EUV) radiation flux detector that includes:

a photodiode with an EUV sensitive region;

a planarizing layer positioned on the EUV sensitive region of the photodiode; and multilayer film positioned on the planarizing layer wherein the multilayer film is exposed to EUV radiation.

DETAILED DESCRIPTION OF THE PREFERRED EMBODIMENTS

Figure 1:
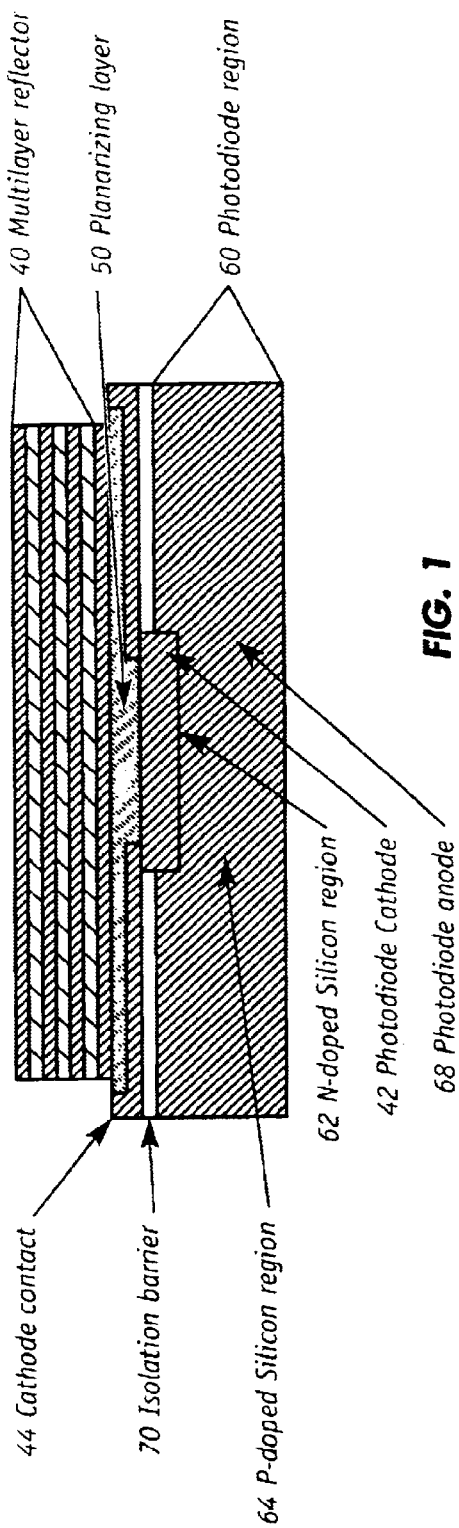
FIG. 1 is a cross-sectional view of the absolute incident flux detector.
Figure 2:
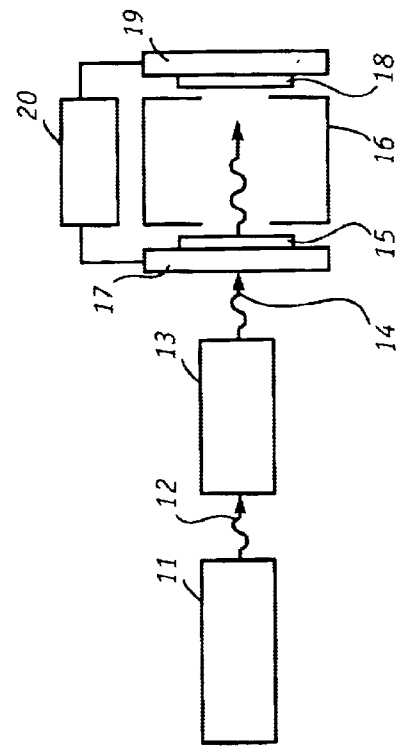
FIG. 2 illustrates a photolithography system.

FIG. 1 shows a monolithic EUV mirror based, absolute flux detector 10 of the present invention. The detector comprises three distinct functional regions: (1) the multilayer reflection stack 40, (2) the planarizing layer 50, and (3) the photodiode region 60. The multilayer reflection stack 40 functions as a reflector for a majority of the incoming EUV radiation. The multilayer stack is programmed at the wavelength of its peak reflectivity for this structure. This stack typically transmits about a fraction of 1% of the total light incident on the multilayer stack. The multilayer reflection stack 40 is designed to reflect at the wavelength of interest and is formed of alternating layers of two or more materials. Preferred materials include, for example, molybdenum (Mo), silicon (Si), tungsten (W), carbon (C), beryllium (Be), ruthenium (Ru), $B_4C$, $Mo_2C$, titanium (Ti), and vanadium (V). Preferred stacks are formed from alternating layers of two materials that are selected from the following list of seven pairs: Mo—Si, W—C, Mo—Be, Ru—$B_4C$, $Mo_2C$—Si, Ti—C, V—C. Alternating layers of Mo and Si are particularly preferred for EUV applications (e.g., on the order of 10 nm). The individual layers of the multilayer stack 40 are formed by conventional techniques such as magnetron or ion-beam sputtering, thermal evaporation, electron beam deposition or electroless chemical deposition.

It is understood that the number of bilayers in the reflective multilayer can vary depending on the desired performance in terms of wavelength and angular and temporal bandwidth. A larger number of layers will provide higher reflectivity at the cost of lower angular and temporal bandwidth. For the multilayer reflection stack, the number of layered pairs will typically range from about 10 to 200 and preferably from about 20 to 80. Moreover, the layer pairs will typically have a bilayer periodicity of about 2 nm to 100 nm and preferably from about 5 nm to 30 nm. By "periodicity" is meant the thickness of one bilayer. Typically, the height of the individual stack layers will range from about 0.2 to 0.8 times the total bilayer thickness and preferably from about 0.4 to 0.6 times the total bilayer thickness.

The planarizing layer 50 serves two functions: first, it defines a micro-fine surface suitable for the growth of a quality multilayer stack 40, and second, it provides an insulating layer between the photodiode cathode 42 and cathode contact 44 and the multilayer stack. The planarizing layer is constructed from a very thin layer (preferably less than 50 nm) of $SiO_2$ which has been polished by a chemical-mechanical polishing process to create a usable substrate. Other suitable dielectric materials include silicon nitride and boron nitride.

The EUV photodiode 60 is preferably a planar photodiode structure with a very shallow diffusion on the top surface of the detector to enhance the detection of EUV photons. The top surface of the diode is passivated to avoid carrier surface recombination before it is coated with the passivating layer. The first of these components is a shallow junction photodiode comprised of an N-doped region 62 and a P-EPI region 64. These regions 62, 64 form the structure of the semiconductor diode and are disposed over a P+ substrate 66 which operates as a base structure for deposition of subsequent layers in the detector fabrication process. An anode region 68 and a cathode 42 serve to electrically connect the device, which is typically reverse-biased in photoconductive mode when in normal operation. Anode region 68 and cathode 42 and cathode contact 44 provide contacts for collecting 100 eV photons optically generated in the N-P-EPI region of the photodiode.

The shallow junction photodiode used in the invention may be of the type commercially available from, for example, International Radiation Detectors. Alternatively, other shallow junction devices can be used, including a P-N rather than the N-P structure described above (that is, the layer which is first impinged by the EUV in an alternative, P-N device would be a P-doped region, disposed over an N-doped substrate). Those skilled in the art would make the selection of the particular photodiode structure in accordance with the contemplated use and mindfully of the advantages and drawbacks attendant to the particular device chosen. Commercially available photodiodes typically include an isolation barrier 70 (FIG. 1) which typically is a layer of $SiO_2$ that is no more than a few microns thick.

In a preferred embodiment, it is expected that the photodiode will detect all wavelengths above about 1.1 eV that transmit through the multilayer stack. However, since the incident light is band-limited prior to the photodiode, this photodiode will measure the EUV fraction that is incident on the multilayer reflection stack of the detector. This fraction of EUV light that is detected by the sensor can be calibrated against an absolute reference, therefore the detector can maintain an absolute calibration.

Fabrication of the above-described structure is as follows. Standard lithographic techniques are first used to create a shallow diffusion photodiode comprising an N region 64 diffused into P+ substrate 62. A metallic cathode 42 and contact 44 are deposited onto the P substrate 62. A corresponding metal anode contact 68 is deposited onto the base surface of the P substrate 62. The silicon dioxide layer 50 is then deposited by a sputtering, chemical vapor deposition or other conventional means. Finally, the multilayer stack 40 is formed over the silicon dioxide layer as described above.

The EUV mirror of the present invention is particularly suited for measuring EUV flux in a photolithography system. For example, the EUV mirror can be incorporated into one or more the mirrors in a condenser. A preferred condenser system is described in Sweatt et al. U.S. Pat. No. 6,118,577, which is incorporated herein. The Sweatt condenser system includes a set of mirrors for collecting extreme ultra-violet radiation from a radiation source that forms a source image, and having correcting mirrors which are capable of translating or rotating, or both, one or more beams from said set of mirrors and which are capable of modifying the convergence of the one or more beams from said set of mirrors and/or the size of the source image. In one embodiment, at least one of the correcting mirrors has a diffraction grating on its surface. The inventive EUV mirror can be used in place of one or more of the mirrors in the condenser system.

In this fashion the EUV mirror accurately measures the EUV flux but does not add an additional reflective surface that attenuates the radiation.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An extreme ultraviolet (EUV) radiation flux detector comprising:
    a photodiode with an EUV sensitive region;
    a planarizing layer positioned on the EUV sensitive region of the photodiode; and
    multilayer film positioned on the planarizing layer wherein the multilayer film is exposed to EUV radiation.

2. The detector of claim 1 wherein the multilayer film reflects a majority of EUV radiation that is incident on the multilayer film.

3. The detector of claim 1 wherein the multilayer film transmits less than about 1% of the EUV radiation incident on the multilayer film.

4. The detector of claim 1 wherein the planarizing layer comprises a dielectric material.

5. The detector of claim 4 wherein the dielectric material is selected from silicon dioxide, silicon nitride, and boron nitride.

6. The detector of claim 1 wherein the photodiode comprises a shallow diffusion region.

7. The detector of claim 1 wherein the photodiode has an upper surface that is passivated.

8. The detector of claim 1 wherein the multilayer turn comprises alternating layers of a first material having a refractive index and, a second material having a refractive index that is larger than that of the second material.

9. The detector of claim 1 wherein the multilayer film comprises about 10 to 200 layer pairs.

10. The detector of claim 9 wherein the layer pairs have a periodicity of about 2 nm to 100 nm.

11. The detector of claim 1 wherein the multilayer film comprises alternating layers of molybdenum and silicon.

12. The detector of claim 11 wherein the multilayer film comprises about 10 to 200 layer pairs.

13. The detector of claim 12 wherein the layer pairs have a periodicity of about 2 nm to 100 nm.

14. The detector of claim 1 wherein the multilayer film is formed of material selected from at least one of Mo—Si, W—C, Mo—Be, Ru—$B_4C$, $Mo_2C$—Si, Ti—C, and V—C.

15. The detector of claim 14 wherein the multilayer film comprises about 10 to 200 layer pairs.

16. The detector of claim 15 wherein the layer pairs have a periodicity of about 5 nm to 100 nm.

17. A method of fabricating an extreme ultraviolet (EUV) radiation flux detector that comprises the steps of:
    (a) providing a photodiode with an EUV sensitive region;
    (b) depositing a planarizing layer on a surface of the EUV sensitive region;
    (c) depositing a multilayer reflection film on the planarizing layer whereby the multilayer reflection film reflects a majority of the EUV radiation that is incident thereon; and
    (d) calibrating the detector.

18. The method of claim 17 wherein the multilayer film transmits less than about 1% of the EUV radiation incident on the multilayer film.

19. The method of claim 17 wherein the planarizing layer comprises a dielectric material.

20. The method of claim 19 wherein the dielectric material is selected from silicon dioxide, silicon nitride, and boron nitride.

21. The method of claim 17 wherein the photodiode comprises a shallow diffusion region.

22. The method of claim 17 wherein the photodiode has an upper surface that is passivated.

23. The method of claim 17 wherein the multilayer film comprises alternating layers of a first material having a refractive index and a second material having a refractive index that is larger than that of the second material.

24. The method of claim 17 wherein the multilayer film comprises about 10 to 200 layer pairs.

25. The method of claim 24 wherein the layer pairs have a periodicity of about 2 nm to 100 nm.

26. The method of claim 17 wherein the multilayer film comprises alternating layers of molybdenum and silicon.

27. The method of claim 26 wherein the multilayer film comprises about 10 to 200 layer pairs.

28. The method of claim 27 wherein the layer pairs have a periodicity of about 2 nm to 100 nm.

29. The method of claim 17 wherein the multilayer film is formed of material selected from at least one of Mo—Si, W—C, Mo—Be, Ru—$B_4$C, $Mo_2$C—Si, Ti—C, and V—C.

30. The method of claim 29 wherein the multilayer film comprises about 10 to 200 layer pairs.

31. The method of claim 30 wherein the layer pairs have a periodicity of about 5 nm to 100 nm.

32. An extreme ultraviolet (EUV) radiation absolute flux detector comprising:

a photodiode with an EUV sensitive region;

a multilayer stack comprised of at least two materials wherein the multilayer stack selectively transmits EUV radiation; and a planarizing layer comprised of a dielectric material disposed between the photodiode and the multilayer stack, wherein the planarizing layer insulates the multilayer stack from the photodiode.

* * * * *